United States Patent
Kouno et al.

(10) Patent No.: US 9,581,659 B2
(45) Date of Patent: Feb. 28, 2017

(54) POSITION DETECTOR WITH MAGNETIC FLUX TRANSMISSION PARTS ENCLOSED BETWEEN TWO OTHER MAGNETIC FLUX TRANSMISSION PARTS

(71) Applicant: DENSO CORPORATION, Kariya, Aichi-pref. (JP)

(72) Inventors: Naoaki Kouno, Chiryu (JP); Tetsuji Yamanaka, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/142,154

(22) Filed: Dec. 27, 2013

(65) Prior Publication Data

US 2014/0184203 A1     Jul. 3, 2014

(30) Foreign Application Priority Data

Dec. 27, 2012 (JP) ................. 2012-286101

(51) Int. Cl.
*G01B 7/30* (2006.01)
*G01B 7/14* (2006.01)
(Continued)

(52) U.S. Cl.
CPC ............. *G01R 33/072* (2013.01); *G01B 7/14* (2013.01); *G01B 7/30* (2013.01); *G01D 5/145* (2013.01)

(58) Field of Classification Search
CPC ........ G01D 5/2283; G01D 5/206; G01D 5/22; G01D 5/2208; G01D 5/2216; G01D 5/2225; G01D 5/2233; G01D 5/2241; G01D 5/225; G01D 5/2258; G01D 5/2266; G01D 5/2275; G01D 5/145; G01D 5/147; G01D 5/16; G01D 5/20; G01D 5/2006; G01D 5/2013; G01D 5/202; G01D 5/2026; G01D 5/2033; G01D 5/204; G01D 5/2046; G01D 5/2053; G01D 5/14; G01D 5/142; G01B 7/02;
(Continued)

(56) References Cited

U.S. PATENT DOCUMENTS 6,222,359 B1 * 4/2001 Duesler et al. .......... 324/207.12
2001/0009366 A1 * 7/2001 Kono et al. ................ 324/207.2
(Continued)

FOREIGN PATENT DOCUMENTS

| JP | 08-292004 | 11/1996 |
|----|-----------|---------|
| JP | 10-104044 | 4/1998 |
| JP | 2014-126553 | 7/2014 |

*Primary Examiner* — David M. Schindler
(74) *Attorney, Agent, or Firm* — Nixon & Vanderhye P.C.

(57) ABSTRACT

A position detector includes a magnet disposed between first ends of first and second magnetic flux transmission parts and a magnet disposed between second ends of the first and second magnetic flux transmission parts. The position detector also includes a Hall IC that moves within a gap and relative to a rotating body. The Hall IC detects a density of the magnetic flux from the first and second magnetic flux transmission parts and outputs a signal according to the density of the magnetic flux passing therethrough in order to detect a position of a detection object. The position detector has third and fourth magnetic flux transmission parts disposed at ends of the first and second magnetic flux transmission parts in a non-contacting manner. As a result, the position detection accuracy of the position detector is improved.

6 Claims, 7 Drawing Sheets

(51) Int. Cl.
*G01R 33/07* (2006.01)
*G01D 5/14* (2006.01)

(58) Field of Classification Search
CPC .......... G01B 7/023; G01B 7/04; G01B 7/046;
G01B 7/14; G01B 7/305; G01B 7/31;
G01B 7/312; G01B 7/30; G01R 15/20;
G01R 15/202; G01R 15/205
See application file for complete search history.

(56) References Cited

U.S. PATENT DOCUMENTS

| | | |
|---|---|---|
| 2004/0227506 A1* | 11/2004 | Shimomura et al. ...... 324/207.2 |
| 2014/0043020 A1* | 2/2014 | Nishikawa et al. ..... 324/207.25 |
| 2014/0184201 A1 | 7/2014 | Kouno et al. |
| 2014/0184204 A1 | 7/2014 | Kouno et al. |
| 2014/0184205 A1 | 7/2014 | Kouno et al. |
| 2014/0184208 A1 | 7/2014 | Kouno et al. |
| 2014/0184209 A1 | 7/2014 | Kouno et al. |
| 2014/0187373 A1 | 7/2014 | Yamanaka et al. |

\* cited by examiner

END PORTION OF DETECTION RANGE
(FULLY-CLOSED POSITION)

END PORTION OF DETECTION RANGE
(FULLY-CLOSED POSITION)

END PORTION OF DETECTION RANGE
(FULLY-CLOSED POSITION)

POSITION DETECTOR WITH MAGNETIC FLUX TRANSMISSION PARTS ENCLOSED BETWEEN TWO OTHER MAGNETIC FLUX TRANSMISSION PARTS

CROSS-REFERENCE TO RELATED APPLICATION

The present application is based on and claims the benefit of priority of Japanese Patent Application No. 2012-286101 filed on Dec. 27, 2012, the disclosure of which is incorporated herein by reference.

TECHNICAL FIELD

The present disclosure generally relates to a position detector for detecting a position of a detection object.

BACKGROUND

Generally, a magnetic-type position detector detects a change in the position of a detection object relative to a reference part. The magnetic-type position detector may utilize a magnetic flux generator such as a magnet. For example, a position detector disclosed in a patent document 1 (i.e., Japanese Patent Laid-Open No. JP-A-H10-104044) is configured to form a closed magnetic circuit having two magnets and two magnetic flux transmission parts that are disposed on a reference part. In such structure, the two magnets are respectively bound by the ends of the two mutually-facing magnetic flux transmission parts. A flow of spill magnetic fluxes from one transmission part to the other occurs within a gap between the respective ends of the two magnetic flux transmission parts. A magnetic flux density detector is configured to move together with the detection object within the gap between the two magnetic flux transmission parts, and to output a detection signal according to the density of the magnetic flux passing therethrough. In such manner, the position detector detects the position of the detection object relative to the reference part based on an output signal that is output from the magnetic flux detector.

In the position detector of the patent document 1, the magnetic flux flows from one magnetic pole to the other in a flying manner around the magnets. Therefore, the absolute value of the density of the magnetic flux which passes through the magnetic flux density detector steeply increases at an end portion of the gap between the two magnetic flux transmission parts (i.e., within a proximity of the magnets). Such magnetic flux may deteriorate the linearity of the signal outputted from the magnetic flux density detector, and may lower the position detecting accuracy at the end portion of the movable range of the detection object.

Therefore, the position detector of the patent document 1 uses bypass yokes that are disposed in contact with both end portions of the magnetic flux transmission parts and the magnets, for forcefully flowing and guiding the "flying" magnetic flux which are otherwise flying from one magnetic pole to the other. In such manner, the steep rise of the absolute value of the magnetic flux density at the end portion of the gap between the two magnetic flux transmission parts is prevented, and the linearity of the signal outputted from the magnetic flux density detector is secured for a wide movable range of the detection object.

However, the position detector of patent document 1, in which the bypass yokes in contact with the end portions of the two magnetic flux transmission parts and the magnets, the magnetic flux generated from the magnet may largely flow to the bypass yoke, thereby causing a decrease of the magnetic flux flowing in the two magnetic flux transmission parts. When the amount of the magnetic flux flowing in the magnetic flux transmission parts decreases, the amount of the spill magnetic flux flowing in the gap between the magnetic flux transmission parts also decreases. In such case, the dynamic range of the magnetic flux density detected by the magnetic flux density detector decreases, which may lead to the deteriorated position detection accuracy of the position detector having such structure.

SUMMARY

It is an object of the present disclosure to provide the position detector that has improved position detection accuracy within a movable range of the detection object without a loss of dynamic range detected by the magnetic flux detector.

In an aspect of the present disclosure, the position detector detects a position of a detection object that moves relative to a reference part. The position detector includes a first magnetic flux transmission part disposed on one of the detection object or the reference part, the first magnetic flux transmission part having a first end and a second end and a second magnetic flux transmission part disposed to defining a gap between the first magnetic flux transmission part and the second magnetic flux transmission part, the second magnetic flux transmission part having a first end and a second end. A first magnetic flux generator is disposed at a position between the first end of the first magnetic flux transmission part and the first end of the second magnetic flux transmission part. A second magnetic flux generator is disposed at a position between the second end of the first magnetic flux transmission part and the second end of the second magnetic flux transmission part. A magnetic flux density detector (i) is disposed on an other of the detection object or the reference part to be movable within the gap relative to the one of the detection object or the reference part and (ii) outputs a signal according to a density of a magnetic flux passing through the magnetic flux density detector. A third magnetic flux transmission part is disposed at a position between the first end of the first magnetic flux transmission part and the first end of the second magnetic flux transmission part and in a non-contacting state with the first magnetic flux transmission part, the second magnetic flux transmission part, and the first magnetic flux generator. A fourth magnetic flux transmission part is disposed at a position between the second end of the first magnetic flux transmission part and the second end of the second magnetic flux transmission part and in a non-contacting state with the first magnetic flux transmission part, the second magnetic flux transmission part, and the second magnetic flux generator.

Further, a first molding connects the first end of the first magnetic flux transmission part, the first end of the second magnetic flux transmission part, and the third magnetic flux transmission part. A second molding connects the second end of the first magnetic flux transmission part, the second end of the second magnetic flux transmission part, and the fourth magnetic flux transmission part.

Moreover, the detection object rotates relative to the reference part and the first magnetic flux transmission part and the second magnetic flux transmission part have a curved shape that is concentric to a center of rotation of the detection object.

Furthermore, the detection object moves linearly relative to the reference part, and the first magnetic flux transmission part and the second magnetic flux transmission part have a straight shape extends along a path of relative movement of the detection object.

In other words, the position detector detects a relative move position of a detection object, which is a position after a relative move of the detection object relative to a reference part, the detector includes: a first magnetic flux transmission part, a second magnetic flux transmission part, a first magnetic flux generator, a second magnetic flux generator, a magnetic flux density detector and a magnetic flux collector.

The first magnetic flux transmission part is disposed on one of the detection object and the reference part. The second magnetic flux transmission part is disposed on one of the detection object or the reference part, so that a gap is formed at a position between the first and second magnetic flux transmission parts.

The first magnetic flux generator is disposed at a position between a first end of the first magnetic flux transmission part and a first end of the second magnetic flux transmission part. Thereby, the magnetic flux generated by the first magnetic flux generator is transmitted from the first end of the first and second magnetic flux transmission parts to a second end of first and second magnetic flux transmission parts.

The second magnetic flux generator is disposed at a position between the second end of the first magnetic flux transmission part and the second end of the second magnetic flux transmission part. Thereby, the magnetic flux generated by the second magnetic flux generator is transmitted from the second end of the first and second magnetic flux transmission parts to the first end of first and second magnetic flux transmission parts.

The magnetic flux density detector is disposed on the one of the detection object or the reference part so that the detector is movable relative to the other of the detection object or the reference part in the gap between the first and second magnetic flux transmission parts. The magnetic flux density detector outputs a signal according to a density of the magnetic flux passing through the detector. In such a structure, the magnetic flux passing through the magnetic flux density detector is, mainly, a spill magnetic flux, which flows through the gap between the first and second magnetic flux transmission parts from one of the two transmission parts to the other (i.e., the magnetic flux flowing either from the first part to the second part or from the second part to the first part).

By devising the above-mentioned configuration, the position detector is enabled to detect a position of the detection object relative to the reference part based on the signal outputted by the magnetic flux density detector.

The third magnetic flux transmission part is disposed at a position between the one end of the first magnetic flux transmission part and the one end of the second magnetic flux transmission part in a non-contact state, which is a state that the third magnetic flux transmission part is in no contact with either of the first magnetic flux transmission part, the second magnetic flux transmission part or the first magnetic flux generator. In such manner, the magnetic flux otherwise flying from one magnetic pole to the other magnetic pole of the first magnetic flux generator is forcefully directed to flow to the third magnetic flux transmission part (i.e., is controlled to transmit in the third magnetic flux transmission part).

The fourth magnetic flux transmission part is disposed at a position between the other end of the first magnetic flux transmission part and the other end of the second magnetic flux transmission part in a non-contact state, which is a state that the fourth magnetic flux transmission part is in no contact with either of the first magnetic flux transmission part, the second magnetic flux transmission part or the second magnetic flux generator. In such manner, the magnetic flux otherwise flying from one magnetic pole to the other magnetic pole of the second magnetic flux generator is forcefully directed to flow to the fourth magnetic flux transmission part (i.e., is controlled to transmit in the fourth magnetic flux transmission part).

By providing the third magnetic flux transmission part and the fourth magnetic flux transmission part, a steep rise of the absolute value of the magnetic flux density in the end portion of the longitudinal gap between the first magnetic flux transmission part and the second magnetic flux transmission part is prevented, and the linearity of the signal outputted from the magnetic flux density detector is secured for a wide movable range of the detection object. Therefore, the position detection accuracy of the present position detector is improved for the wide movable range of the detection object.

In the present disclosure, the third magnetic flux transmission part and the fourth magnetic flux transmission part are disposed in the non-contacting state, having no contact with the first magnetic flux transmission part, the second magnetic flux transmission part, the first magnetic flux generator, or the second magnetic flux generator. Therefore, in comparison to a contacting structure in which the third magnetic flux transmission part and the fourth magnetic flux transmission part are in contact with the first magnetic flux transmission part, the second magnetic flux transmission part, the first magnetic flux generator, and the second magnetic flux generator, the amount of the magnetic flux generated from the first magnetic flux generator and the second magnetic flux generator to flow to the third magnetic flux transmission part and the fourth magnetic flux transmission part is reduced. Thereby, a reduction of the amount of the magnetic flux flowing to the first magnetic flux transmission part and the second magnetic flux transmission part is prevented. As a result, a reduction of the spill magnetic flux between the first magnetic flux transmission part and the second magnetic flux transmission part is prevented, thereby enabling a reduction of a dynamic range of the magnetic flux density detected by the magnetic flux density detector detects is prevented.

Thus, in the present disclosure, while preventing a reduction of the dynamic range of the magnetic flux density which is detected by the magnetic flux density detector, the position detection accuracy for detecting a position of the detection object is improved for a wide movable range thereof.

BRIEF DESCRIPTION OF THE DRAWINGS

Other objects, features and advantages of the present disclosure become more apparent from the following detailed description disposed with reference to the accompanying drawings, in which.

DETAILED DESCRIPTION

Figure 1:
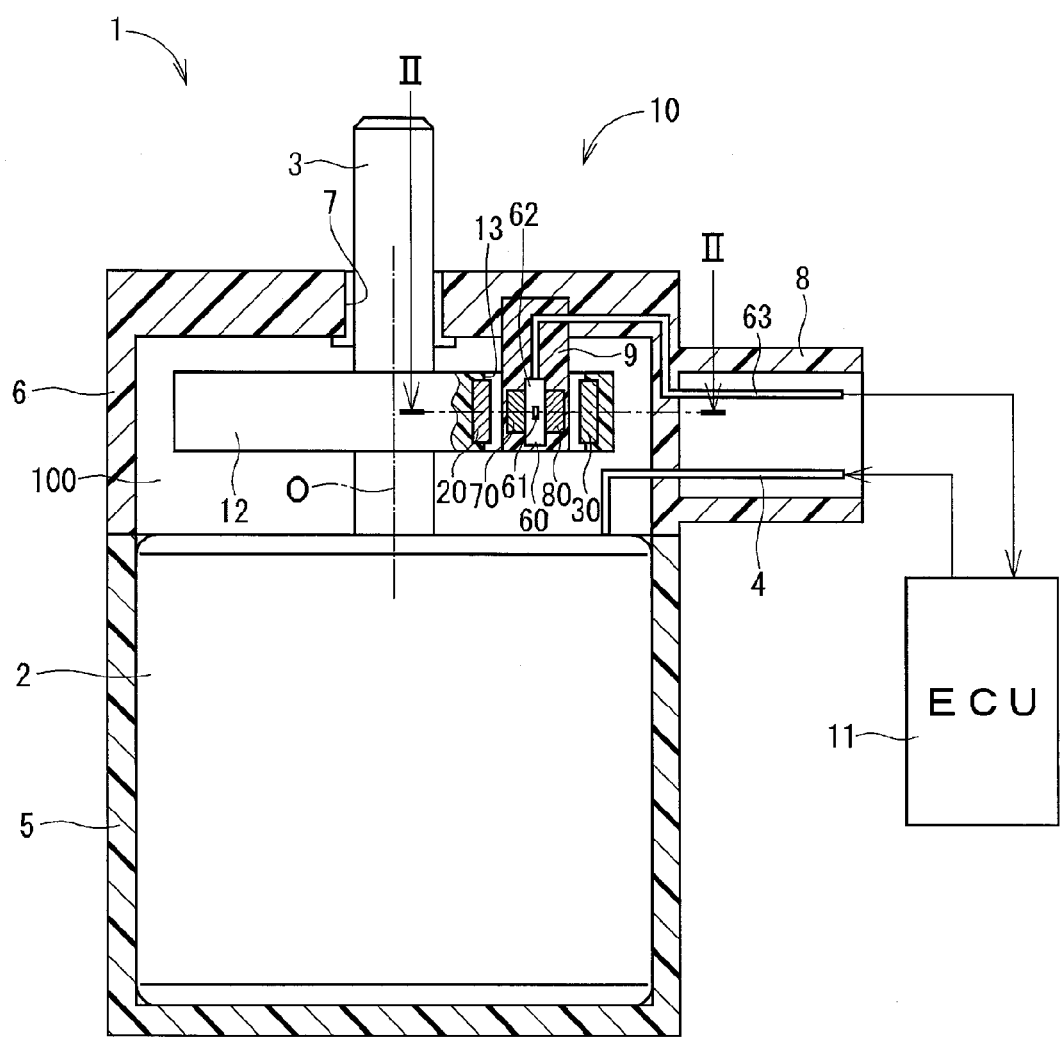
FIG. 1 is a sectional view of a position detector and an actuator in a first embodiment of the present disclosure.

Hereafter, the position detector in plural embodiments of the present disclosure and the actuator using the same are explained based on the drawing. In the plural embodiments, the same numerals are assigned to the same components, and explanation of the same components will not be repeated.

First Embodiment

The position detector in the first embodiment of the present disclosure and the actuator using the same are shown in FIGS. 1 and 2.

An actuator 1 is used as a driving power source which drives a throttle valve of a vehicle (not illustrated), for example. The actuator 1 is provided with a motor 2, a housing 5, a cover 6, an electronic control unit (hereinafter "ECU") 11, a rotating body 12, a position detector 10, together with other parts.

As shown in FIG. 1, the motor 2 has an output shaft 3, a motor terminal 4 and the like. An electric power is supplied to the motor 2 via the motor terminal 4. The motor 2 rotates by receiving the electric power from the terminal 4. Rotation of the motor 2 is outputted from the output shaft 3. The output shaft 3 is connected to a throttle valve via a geartrain (not illustrated) or the like, for example. Therefore, when the motor 2 rotates, the throttle valve also rotates.

The housing 5 is made of resin to have a cylinder shape with a bottom, for example, and has the motor 2 accommodated in an inside thereof.

The cover 6 is made of resin to have a cylinder shape with a bottom, for example, and has its opening abutted to an opening of the housing 5 in a state that the output shaft 3 is inserted into a cavity 7 which is bored on the bottom of the cover 6. In such manner, a hollow space 100 is defined at a position between the cover 6 and the motor 2.

The cover 6 has a connector 8 formed in a pipe shape and extending in a radial outside direction from a cylinder shape body of the cover 6. In the connector 8, an end of the motor terminal 4 is exposed. The connector 8 is connected to an end of a wire harness leading to the ECU 11. Thereby, the electric power from the battery (not illustrated) is supplied to the motor 2 via the ECU 11, the wire harness, and the motor terminal 4.

The ECU 11 is a computer provided with a CPU serving as a calculation unit together with ROM, RAM serving as a memory unit, an input/output interface and other parts. The ECU 11 controls the operation of the various devices installed in the vehicle based on the signal and the like from various sensors attached to various parts of the vehicle.

The ECU 11 controls the electric power supplied to the motor 2, for example, based on an accelerator opening signal from an accelerator pedal, or the like. When the electric power is supplied to the motor 2, the motor 2 rotates to rotate a throttle valve. Therefore, the throttle valve opens and closes an air intake passage, and an amount of an intake air flowing through the air intake passage is adjusted. In the present embodiment, the ECU 11 may also control a supply of the electric power to the motor 2 by an idle speed control (ISC) function, for example, irrespective of the opening signal from the accelerator pedal.

The rotating body 12 is, for example, made of resin to have a disk shape, and is disposed in the hollow space 100. The rotating body 12 is being fixed onto the output shaft 3 with the output shaft 3 extending therethrough at its center. Therefore, when the output shaft 3 rotates, the rotating body 12 rotates together with the output shaft 3. Since the output shaft 3 and the throttle valve are connected by the geartrain, the rotation position of the rotating body 12 corresponds to the rotation position of the throttle valve.

According to the present embodiment, the position detector 10 detects the rotation position of the rotating body 12 that moves and rotates relative to the cover 6. Therefore, by detecting the rotation position of the rotating body 12 which rotates relative to the cover 6, the rotation position of the throttle valve is detected and an opening degree of the throttle valve is also detected. Thus, the position detector 10 is capable of serving as a throttle position sensor.

Figure 2A:
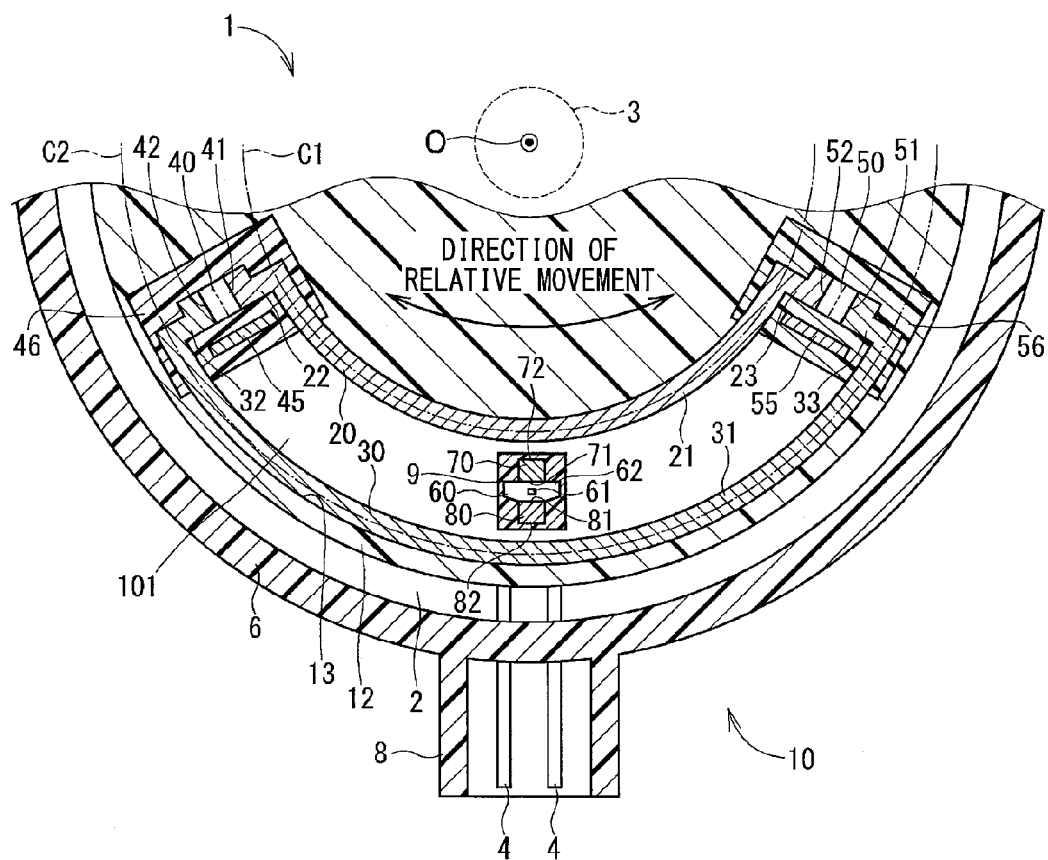
FIG. 2A is a sectional view along a line II-II of FIG. 1.
Figure 2B:
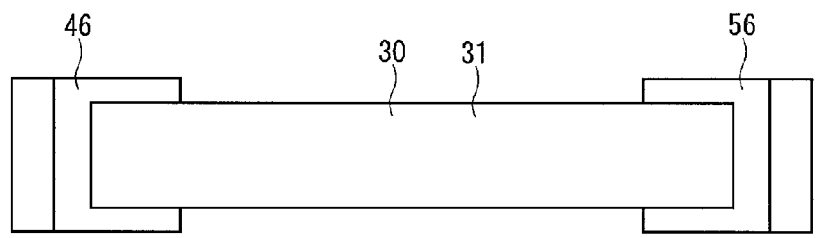
FIG. 2B is a side view of a second magnetic flux transmission part, a first molding, and a second molding seen from a radial outside of a first virtual circle.

As shown in FIG. 1 and FIGS. 2A and 2B, the position detector 10 includes a first magnetic flux transmission part 20, a second magnetic flux transmission part 30, a magnet 40 serving as a first magnetic flux generator, a magnet 50 serving as a second magnetic flux generator, a Hall IC 60 serving as a magnetic flux density detector, a third magnetic flux transmission part 45, a fourth magnetic flux transmission part 55, a first molding 46, a second molding 56, a first magnetic flux collector 70, a second magnetic flux collector 80 together with other parts.

The first magnetic flux transmission part 20 is made of a material which has a relatively high magnetic permeability, such as a silicon steel, or the like. The first magnetic flux transmission part 20 is disposed in an arc-shape cavity 13 that is formed on the rotating body 12.

The first magnetic flux transmission part 20 has a center section 21, a first end 22, and a second end 23. The center section 21 has a shape which extends along a first virtual circle C1 that centers on a rotation axis O of the rotating body 12 (refer to FIG. 2A). The first end 22 is formed to extend from one end of the center section 21 toward a radial outside of the first virtual circle C1. The second end 23 is formed to extend from the other end of the center section 21 toward the radial outside of the first virtual circle C1.

The second magnetic flux transmission part 30 is made of the material which has a relatively high magnetic permeability, such as a silicon steel or the like, similar to the first magnetic flux transmission part 20. The second magnetic flux transmission part 30 is disposed in the cavity 13 that is formed on the rotating body 12.

The second magnetic flux transmission part 30 has a center section 31, a first end 32, and a second end 33. The center section 31 has a shape which extends along a second virtual circle C2 that has a larger radius than the first virtual circle C1 and centers on the rotation axis O of the rotating body 12 (refer to FIG. 2A). The first end 32 is formed to extend from one end of the center section 31 toward a radial inside of the second virtual circle C2. The second end 33 is formed to extend from the other end of the center section 31 to the radial inside of the second virtual circle C2.

As shown in FIGS. 1, 2A, and 2B, the first magnetic flux transmission part 20 and the second magnetic flux transmission part 30 are disposed in the cavity 13 of the rotating body 12 so that the center section 21 of the first magnetic flux transmission part 20 and the center section 31 of the second magnetic flux transmission part 30 face each other in the radial direction of the first virtual circle C1. Thereby, an arc-shape gap 101 is formed between the center section 21 of the first magnetic flux transmission part 20 and the center section 31 of the second magnetic flux transmission part 30 (refer to FIG. 2A).

The magnet 40 is a permanent magnet, such as a neodymium magnet, a ferrite magnet, or the like, for example. The magnet 40 has a magnetic pole 41 on one end, and has a magnetic pole 42 on the other end. The magnet 40 is magnetized so that a magnetic pole 41 side serves as an N pole, and a magnetic pole 42 side serves as an S pole. The magnet 40 is disposed at a position between the first end 22 of the first magnetic flux transmission part 20 and the first end 32 of the second magnetic flux transmission part 30 so that the magnetic pole 41 abuts the first end 22 of the first magnetic flux transmission part 20, and the magnetic pole 42 abuts the first end 32 of the second magnetic flux transmission part 30. Thereby, the magnetic flux generated by the magnetic pole 41 of the magnet 40 is transmitted from the first end 22 of the first magnetic flux transmission part 20 to the second end 23 via the center section 21.

The magnet 50 is also a permanent magnet, such as a neodymium magnet, a ferrite magnet, or the like, for example, similar to the magnet 40. The magnet 50 has a magnetic pole 51 on one end, and has a magnetic pole 52 on the other end. The magnet 50 is magnetized so that a magnetic pole 51 side serves as an N pole, and a magnetic pole 52 side serves as an S pole. The magnet 50 is disposed at a position between the second end 33 of the second magnetic flux transmission part 30 and the second end 23 of the first magnetic flux transmission part 20 so that the magnetic pole 51 abuts the second end 33 of the second magnetic flux transmission part 30, and the magnetic pole 52 abuts the second end 23 of the first magnetic flux transmission part 20. Thereby, the magnetic flux generated by the magnetic pole 51 of the magnet 50 is transmitted from the second end 33 of the second magnetic flux transmission part 30 to the first end 32 via the center section 31.

Here, the spill magnetic flux flows through the gap 101, either from the first magnetic flux transmission part 20 to the second magnetic flux transmission part 30, or from the second magnetic flux transmission part 30 to the first magnetic flux transmission part 20.

In the present embodiment, the magnet 40 and the magnet 50 are configured to be the same permanent magnet having the same volume, the same type, the same material configuration, and the same magnetization adjustment method. Therefore, the spill magnetic flux flows from the second magnetic flux transmission part 30 to the first magnetic flux transmission part 20 in an area between a longitudinal center position of the gap 101 and the magnet 50, and the spill magnetic flux flows from the first magnetic flux transmission part 20 to the second magnetic flux transmission part 30 in an area between the longitudinal center position and the magnet 40. More specifically, the closer the position along the longitudinal direction of the gap 101 is to the magnet 40 or to the magnet 50, the greater an absolute value of the magnetic flux density becomes. Further, the magnetic flux density is equal to 0 at the longitudinal center position of the gap 101.

Further, the magnetic flux at positions around the magnet 40 "flies" from the magnetic pole 41 to the magnetic pole 42, and the magnetic flux at positions around the magnet 50 "flies" from the magnetic pole 51 to the magnetic pole 52.

The Hall IC 60 has a Hall element 61 serving as a signal output element, as well as a sealer 62 and a sensor terminal 63 and the like. The Hall element 61 outputs a signal according to the density of the magnetic flux passing therethrough. The sealer 62 is made of resin and has a rectangular board shape, for example. A first end of the sensor terminal 63 is connected to the Hall element 61. The sealer 62 covers an entire Hall element 61, as well as the first end side of the sensor terminal 63. In this case, the Hall element 61 is located at the center of the sealer 62.

The sealer 62 that seals the Hall IC 60 and the first end side of the sensor terminal 63 are molded by a mold 9. The mold 9 is a resin mold, for example, and has a square pole shape. The sealer 62 that seals the Hall IC 60 is molded at a position on one end side of the mold 9.

The mold 9 is disposed on the cover 6 so that one end of the mold 9 is positioned in the gap 101 and the other end of the mold 9 is connected to the bottom of the cover 6. In such manner, the Hall IC 60 is rotatably moved, relative to the rotating body 12, in the gap 101 between the first magnetic flux transmission part 20 and the second magnetic flux transmission part 30. The cover 6 and the mold 9 are respectively equivalent to a reference part in the claims, and the rotating body 12 is equivalent to a detection object in the claims.

The sensor terminal 63 of the Hall IC 60 has a second end formed to be exposed in an inside of the connector 8 of the cover 6 by an insert-molding method in the cover 6. Therefore, when an end of the wire harness leading to the ECU 11 is connected to the connector 8, the Hall element 61 of the Hall IC 60 is connected to the ECU 11. Thereby, a signal from the Hall element 61 is transmitted to the ECU 11.

In this case, the magnetic flux passing through the Hall element 61 of the Hall IC 60 is mainly made of the spill magnetic flux which flows through the gap 101 between the first magnetic flux transmission part 20 and the second magnetic flux transmission part 30 either (i) from the second magnetic flux transmission part 30 to the first magnetic flux transmission part 20 or (ii) from the first magnetic flux transmission part 20 to the second magnetic flux transmission part 30.

In the present embodiment, the spill magnetic flux flows from the first magnetic flux transmission part 20 to the second magnetic flux transmission part 30 in an area between the longitudinal center position of the gap 101 and the magnet 40 as mentioned above. The spill magnetic flux flows from the second magnetic flux transmission part 30 to the first magnetic flux transmission part 20 in an area between the longitudinal center position of the gap 101 and the magnet 50. Further, when a position along the longitudinal direction of the gap 101 is closer to the magnet 40 or to the magnet 50, the greater an absolute value of the magnetic flux density becomes.

Therefore, if assumed that a flow direction of the spill magnetic flux flowing from the second magnetic flux transmission part 30 to the first magnetic flux transmission part 20 is a negative direction, when a position of the Hall IC 60 rotatably moves from a proximity of the magnet 50 to a proximity of the magnet 40 in the gap 101, the magnetic flux density monotonically increases from a negative value to a positive value, thereby (i) identifying a rotation position of the Hall IC 60 uniquely according to the detected magnetic flux density and (ii) outputting a signal that uniquely identifies the rotation position of the Hall IC 60.

According to the above-mentioned configuration, the ECU 11 is capable of detecting the rotation position of the rotating body 12 relative to the cover 6 based on the signal outputted from the Hall IC 60. In such manner, the rotation position and an opening degree of the throttle valve are detected.

The first magnetic flux collector 70 is made of a relatively high magnetically permeable material such as a permalloy or the like, and has a hexahedron body. The first magnetic flux collector 70 is disposed on a first side of the mold 9 so that a predetermined face 71 of the collector 70 faces or abuts a center of one face on a first magnetic flux transmission part 20 side of the sealer 62 of the Hall IC 60. An opposite face 72 of the first magnetic flux collector 70, which is opposite to the face 71, faces the center section 21 of the first magnetic flux transmission part 20.

The second magnetic flux collector 80 is, similar to the first magnetic flux collector 70, made of a relatively high magnetically permeable material such as a permalloy or the like, and has a hexahedron body. The second magnetic flux collector 80 is disposed on a second side of the mold 9 so that a predetermined face 81 of the collector 80 faces or abuts a center of one face on a second magnetic flux transmission part 30 side of the sealer 62 of the Hall IC 60. A face 82 of the second magnetic flux collector 80, which is opposite to the face 81, faces the center section 31 of the second magnetic flux transmission part 30.

Thus, the Hall IC 60 is sandwiched or bound in between the first magnetic flux collector 70 and the second magnetic flux collector 80, and such sandwiching or binding direction is substantially the same as the facing direction of facing between the first magnetic flux transmission part 20 and the second magnetic flux transmission part 30. The spill magnetic flux which flows through the gap 101 between the first magnetic flux transmission part 20 and the second magnetic flux transmission part 30 is concentrated in such manner, and is directed to flow to (i.e., pass through) the Hall IC 60.

The third magnetic flux transmission part 45 is, similar to the first and second magnetic flux collectors 70, 80, made of a relatively high magnetic permeability material such as a permalloy or the like. The third magnetic flux transmission part 45 has a board shape, for example, and is disposed at a position between the center section 21 of the first magnetic flux transmission part 20 and the center section 31 of the second magnetic flux transmission part 30 in a non-contacting state, i.e., in contact with none of the first and second magnetic flux transmission parts 20, 30, and the magnet 40, with its board shape aligned with a radial direction of the first virtual circle C1 (refer to FIG. 2A).

The fourth magnetic flux transmission part 55 is, similar to the third magnetic flux collector 45, made of a relatively high magnetic permeability material such as a permalloy or the like. The fourth magnetic flux transmission part 55 has a board shape, for example, and is disposed at a position between the center section 21 of the first magnetic flux transmission part 20 and the center section 31 of the second magnetic flux transmission part 30 in a non-contacting state, i.e., in contact with none of the first and second magnetic flux transmission parts 20, 30, and the magnet 50, with its board shape aligned with a radial direction of the first virtual circle C1 (refer to FIG. 2A).

The first molding 46 made of resin is, for example, disposed to mold the first end 22 of the first magnetic flux transmission part 20, the first end 32 of the second magnetic flux transmission part 30, and the third magnetic flux transmission part 45.

The second molding 56 made of resin is, for example, disposed to mold the second end 23 of the first magnetic flux transmission part 20, the second end 33 of the second magnetic flux transmission part 30, and the fourth magnetic flux transmission part 55.

Figure 3:
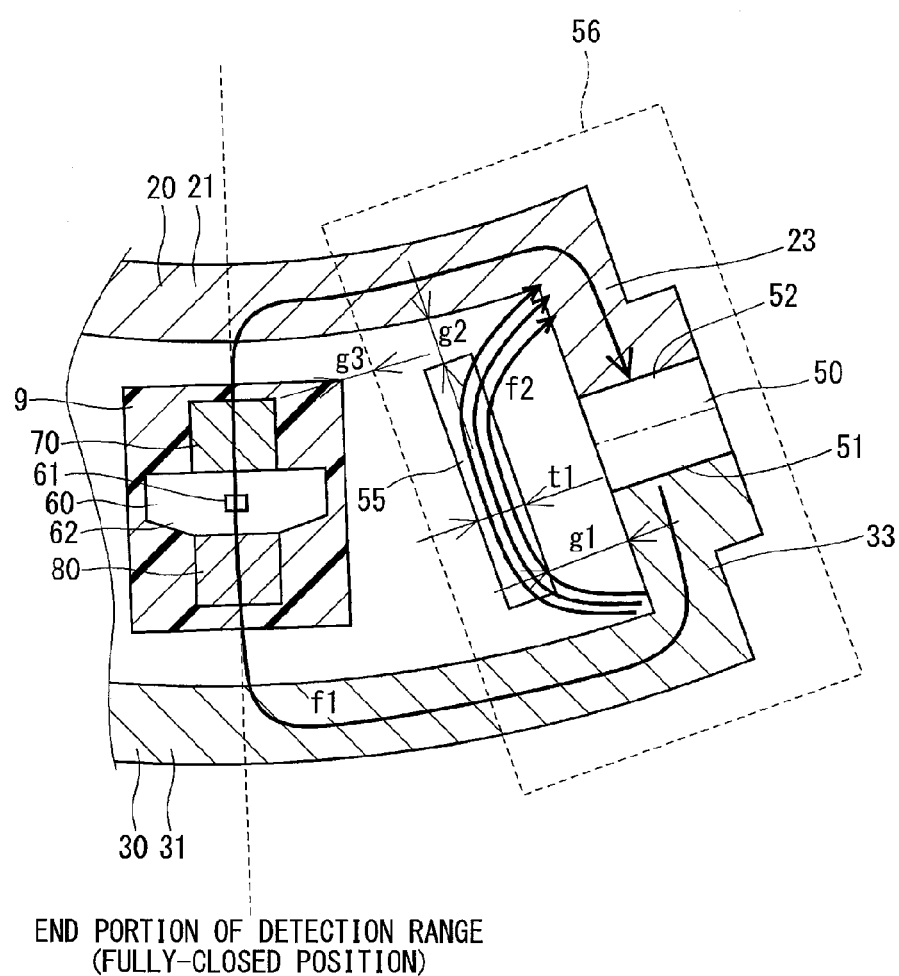
FIG. 3 is a sectional view of a second magnetic flux generator of a position detector in the first embodiment of the present disclosure.

By having the above-mentioned configuration, as shown in FIG. 3, a magnetic flux f2, which flows at a proximity of the magnet 50 from the magnetic pole 51 to the magnetic pole 52 in a flying manner, flows through the fourth magnetic flux transmission part 55. Similarly, the magnetic flux, which flows at a proximity of the magnet 40 from the magnetic pole 41 to the magnetic pole 42 in a flying manner, flows through the third magnetic flux transmission part 45. In other words, the magnetic flux flying from the magnetic pole 41 to the magnetic pole 42 of the magnet 40, and the magnetic flux flying from the magnetic pole 51 to the magnetic pole 52 of the magnet 50 are forcefully directed to flow to the third magnetic flux transmission part 45 or the fourth magnetic flux transmission part 55 (i.e., is controlled to transmit in the third magnetic flux transmission part 45 or in the fourth magnetic flux transmission part 55).

In this case, a board thickness t1 of the fourth magnetic flux transmission part 55 is set up to prevent saturation of the magnetic flux f2. Further, a distance g1, which is a distance between the fourth magnetic flux transmission part 55 and the magnet 50, second end 23 of the first magnetic flux transmission part 20, and second end 33 of the second magnetic flux transmission part 30, and a distance g2, which is a distance between the fourth magnetic flux transmission part 55 and the center section 21 of the first magnetic flux transmission part 20, or the center section 31 of the second magnetic flux transmission part 30 are configured so that a magnetic flux f1 which flows from the magnetic pole 51 to the magnetic pole 52 of the magnet 50 via the second end 33 of the second magnetic flux transmission part 30, the center section 31 of the second magnetic flux transmission part 30, the second magnetic flux collector 80, the Hall IC 60, the first magnetic flux collector 70, the center section 21 of the first magnetic flux transmission part 20, and the second end 23 of the first magnetic flux transmission part 20 has a value that is equal to or greater than a predetermined value. Further, a distance g3 between the second molding 56 and the mold 9 is set up so that the second molding 56 and the mold 9 do not interfere with each other when the rotating body 12 is moved to the end portion of a detection range relative to the mold 9. The third magnetic flux transmission part 45 and the first molding 46 are configured to have the same relationship as the one between the fourth magnetic flux transmission part 55 and the second molding 56.

Figure 4:
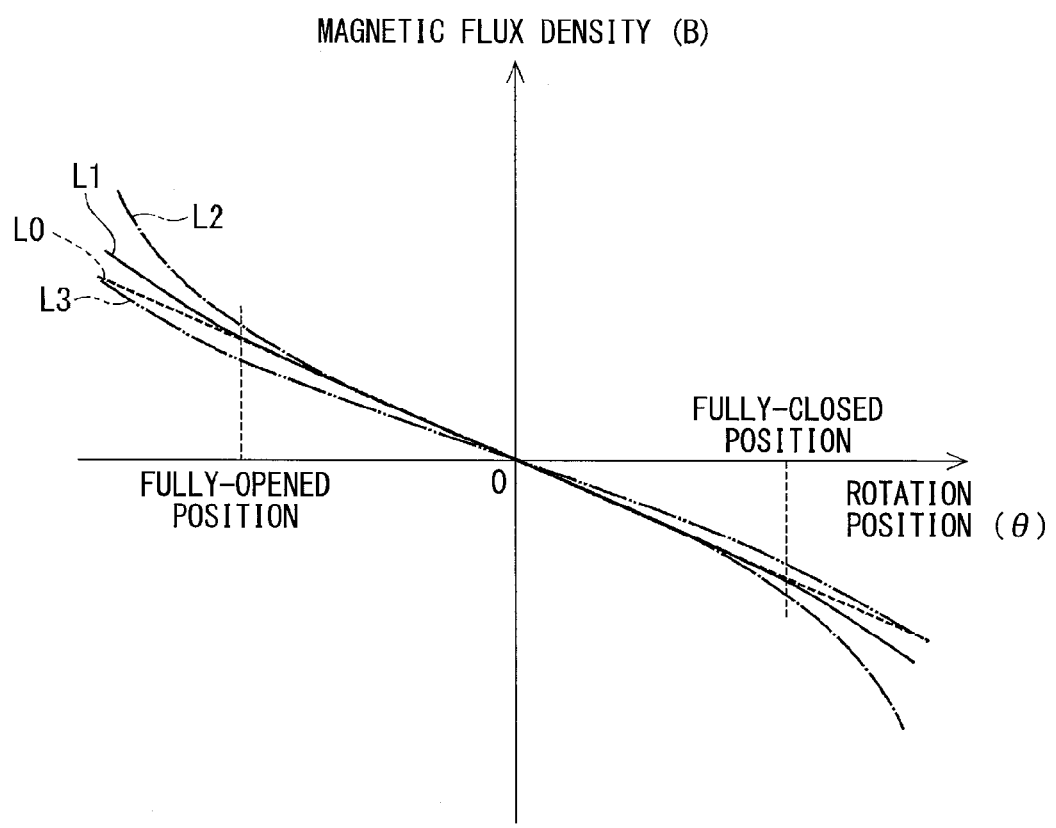
FIG. 4 is a diagram of a relationship between (i) a magnetic flux density detected by a magnetic flux density detector in the first embodiment of the present disclosure and by the detector in a comparative example and (ii) a position of a detection object relative to a reference part.

According to the present embodiment, the magnetic flux density detected by the Hall IC 60 is shown by a line L1 in FIG. 4. In addition to the spill magnetic flux which flows between the first magnetic flux transmission part 20 and the second magnetic flux transmission part 30, the magnetic flux which flies from the magnetic pole 41 to the magnetic pole 42 of the magnet 40 and the magnetic flux which flies from the magnetic pole 51 to the magnetic pole 52 of the magnet 50 flow at the proximity of the magnet 40 and the magnet 50 in the gap 101. Therefore, the change rate of the absolute value of the magnetic flux represented by the line L1 increases toward the end portion of the gap 101. However, in the present embodiment, a certain part of the flying magnetic flux, which flies from the magnetic pole 41 to the magnetic pole 42 of the magnet 40 or from the magnetic pole 51 to the magnetic pole 52 of the magnet 50, flows through the third magnetic flux transmission part 45 or the fourth magnetic flux transmission part 55. Therefore, due to such flows of the magnetic flux in the third and fourth magnetic flux transmission parts, the shape of the line L1 becomes very close to an ideal straight line L0 illustrated as a dashed line in FIG. 4, which represents a linear relationship between the position change and the magnetic flux. When the line representing a relationship between the position and the magnetic flux is closer to the ideal straight line, the position detection accuracy for detecting the throttle valve opening is improved for a wider movable range of the valve.

In the present embodiment, the relationship between the magnetic flux density and the movable range of the rotating body 12 (i.e., a range from the fully-closed position to a fully-opened position of the throttle valve) is shown in FIG. 4. That is, in the present embodiment, the position detection of the rotating body 12 is performed in a range where the line L1 has a relatively high linearity.

The advantages of the position detector in the present embodiment are clarified by describing the first and second comparative examples of a position detector in the following.

Figure 5:
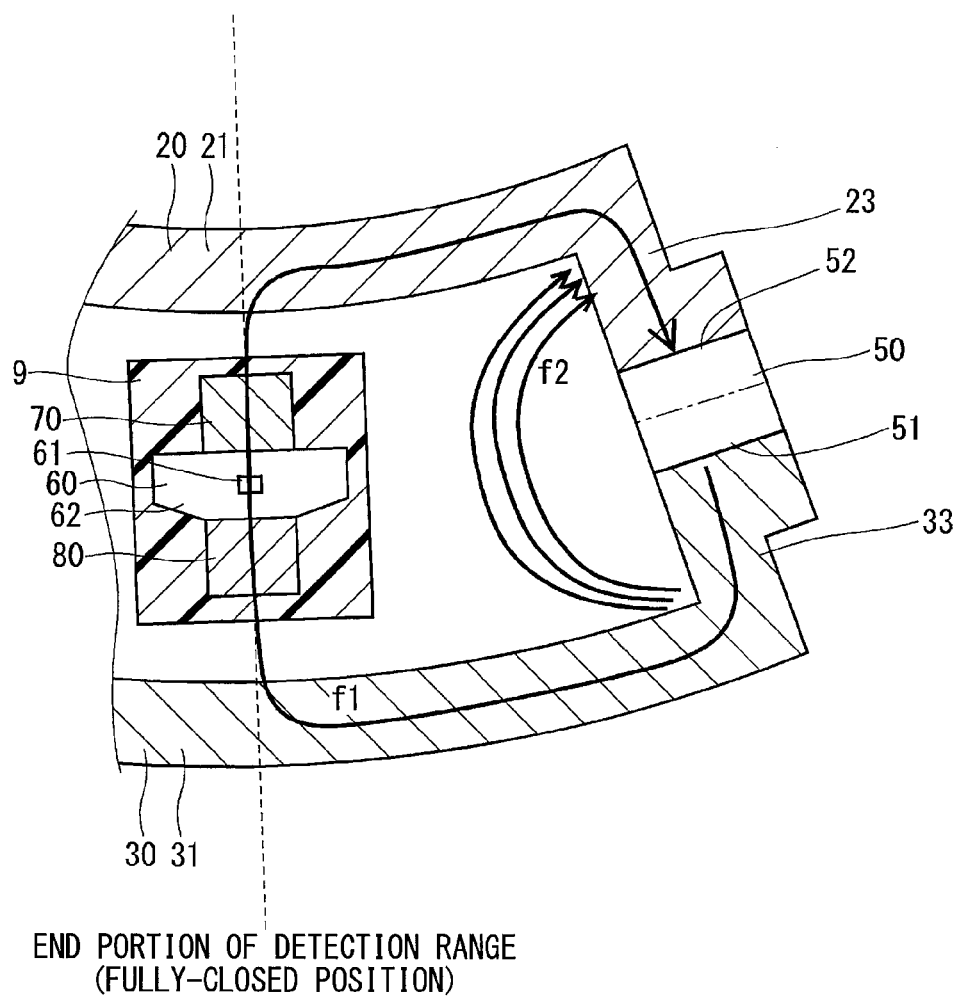
FIG. 5 is a sectional view of the second magnetic flux generator in a first comparative example.

As shown in FIG. 5, the first comparative example does not have the fourth magnetic flux transmission part 55 and the second molding 56. Further, it does not have the third magnetic flux transmission part 45 and the first molding 46. Therefore, the flying magnetic flux f2, which flows at the proximity of the magnet 50 from the magnetic pole 51 to the magnetic pole 52 in a flying manner, flows through a position that is closer to the Hall IC 60 in comparison to the first embodiment. Also, the magnetic flux, which flows at the proximity of the magnet 40 from the magnetic pole 41 to the magnetic pole 42 in a flying manner, flows through a position that is closer to the Hall IC 60, in comparison to the first embodiment. Therefore, the magnetic flux density detected by the Hall IC 60 in the first comparative example is represented by a line L2 in FIG. 4 which is a dashed-dotted line. As shown in FIG. 4, the end portions of the line L2 are greatly diverted from the ideal straight line L0 in comparison to the line L1. Therefore, at a position close to the fully-opened position and the fully-closed position of the throttle valve in the first comparative example, the position detection accuracy may deteriorate.

Figure 6:
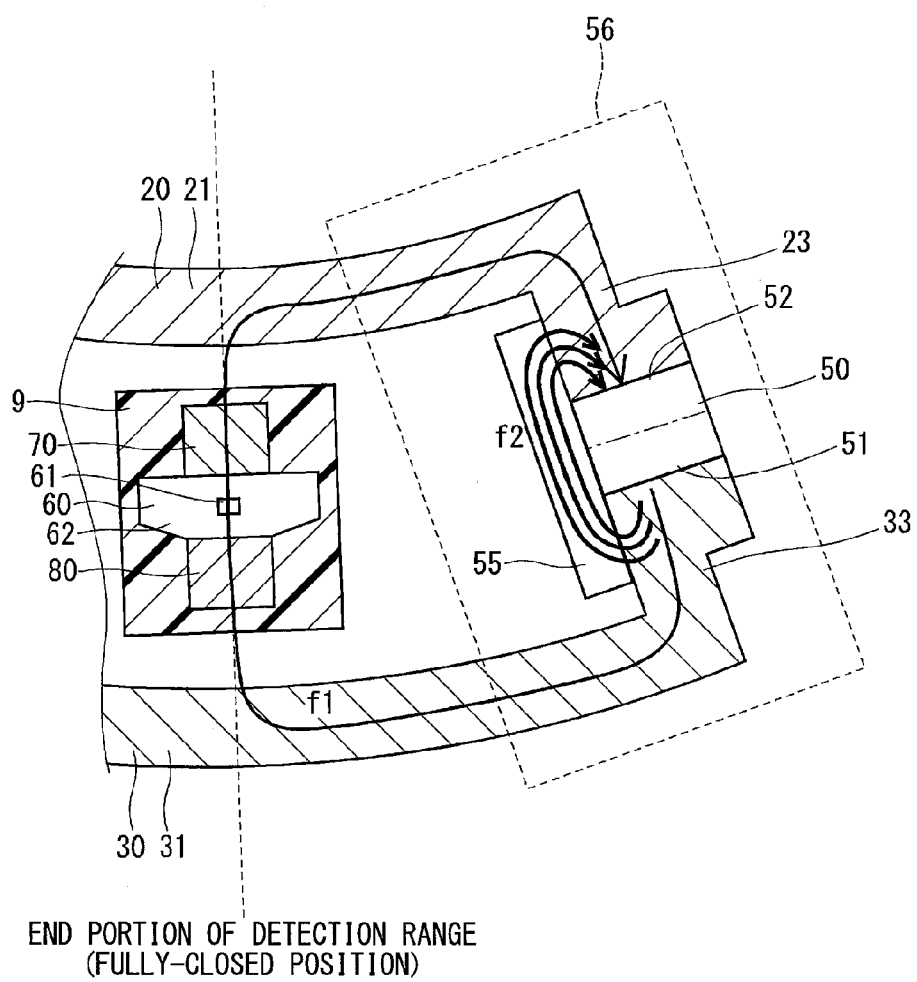
FIG. 6 is a sectional view of the second magnetic flux generator in a second comparative example.

As shown in FIG. 6, in the second comparative example, the fourth magnetic flux transmission part 55 is disposed in contact with the second end 23 of the first magnetic flux transmission part 20, the second end 33 of the second magnetic flux transmission part 30, and the magnet 50. Further, the third magnetic flux transmission part 45 is disposed in contact with the first end 22 of the first magnetic flux transmission part 20, the first end 32 of the second magnetic flux transmission part 30, and the magnet 40. Therefore, the flying magnetic flux f2, which flows at the proximity of the magnet 50 from the magnetic pole 51 to the magnetic pole 52 in a flying manner, largely flows through the fourth magnetic flux transmission part 55. Also, the magnetic flux, which flows at the proximity of the magnet 40 from the magnetic pole 41 to the magnetic pole 42 in a flying manner, largely flows through the third magnetic flux transmission part 45. Therefore, the magnetic flux density detected by the Hall IC 60 in the second comparative example is represented by a line L3 in FIG. 4, which is a dashed-and-double-dotted line. As shown in FIG. 4, the shape of the line L3 indicates that, in comparison to the lines L1 and L0, the absolute value of the magnetic flux density is smaller. In other words, it indicates that the dynamic range of the magnetic flux density detected by the Hall IC 60 is smaller in the second comparative example, in comparison to the first embodiment.

As mentioned above and in comparison to the first comparative example, the position detector in the first embodiment provides improved position detection accuracy within a wider movable range of the rotating body 12 (i.e., the throttle valve). Further, the dynamic range of the magnetic flux density detected by the Hall IC 60 is greater in comparison to the second comparative example.

As explained above, by providing the third magnetic flux transmission part 45 and the fourth magnetic flux transmission part 55, the steep rise of the absolute value of the magnetic flux density in the end portions of the gap 101 between the first magnetic flux transmission part 20 and the second magnetic flux transmission part 30 is prevented. Further, the linearity of the output signal from the Hall IC 60 is provided for a wider movable range of the rotating body 12 (i.e., the throttle valve). Therefore, the position detection accuracy is improved for the wider movable range of the rotating body 12.

Further, in the present embodiment, the third magnetic flux transmission part 45 and the fourth magnetic flux transmission part 55 are disposed in a non-contacting state (i.e., in contact with none of in the first magnetic flux transmission part 20, the second magnetic flux transmission part 30, the magnet 40, and the magnet 50). Therefore, in comparison to the second comparative example where the part 45 and the part 55 are provided in a contacting state, the amount of the magnetic flux flowing from the magnets 40, 50 to the third magnetic flux transmission part 45 and the fourth magnetic flux transmission part 55 is reduced in the present embodiment. Thereby, a reduction of the amount of the magnetic flux flowing into the first magnetic flux transmission part 20 and the second magnetic flux transmission part 30 is restricted. As a result, a reduction of the spill magnetic flux between the first magnetic flux transmission part 20 and the second magnetic flux transmission part 30 is restricted, and the fall of the dynamic range of the magnetic flux density detected by the Hall IC 60 is restricted.

Thus, in the present embodiment, while preventing a reduction of the dynamic range of the magnetic flux density detected by the Hall IC 60, the position detection accuracy for detecting the position of the rotating body 12 (i.e., the throttle valve) is improved for a wider movable range.

Further, in the present embodiment, the first molding 46 is disposed to mold the first end 22 of the first magnetic flux transmission part 20, the first end 32 of the second magnetic flux transmission part 30, and the third magnetic flux transmission part 45. Further, the second molding 56 is disposed to mold the second end 23 of the first magnetic flux transmission part 20, the second end 33 of the second magnetic flux transmission part 30, and the fourth magnetic flux transmission part 55. Therefore, the first molding 46 and the second molding 56 are used to hold the third magnetic flux transmission part 45 and the fourth magnetic flux transmission part 55 in a non-contacting state (i.e., in contact with none of the first magnetic flux transmission part 20, the second magnetic flux transmission part 30, the magnet 40, and the magnet 50), for protecting the magnet 40 and the magnet 50.

Second Embodiment

Figure 7:
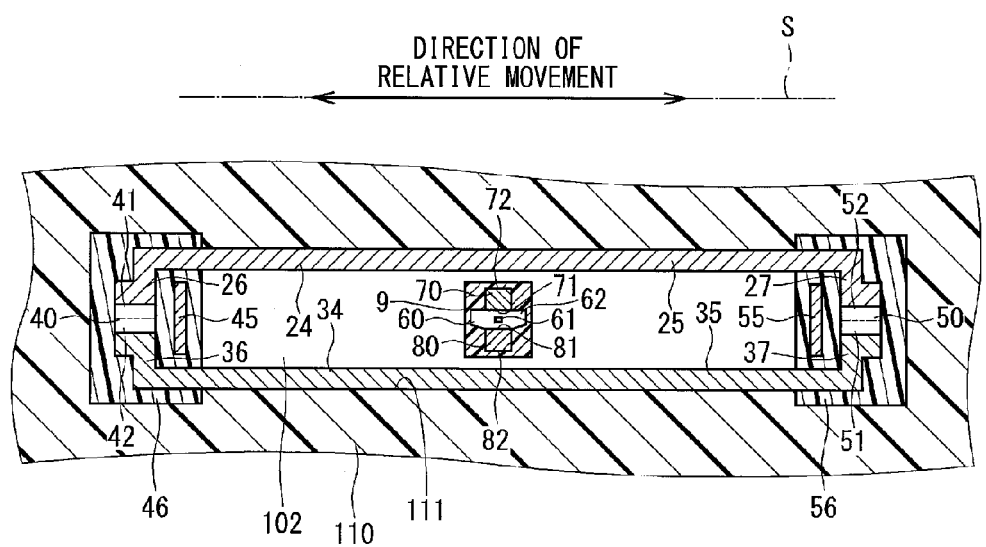
FIG. 7 is a sectional view of the position detector in a second embodiment of the present disclosure.

The position detector in the second embodiment of the present disclosure is shown in FIG. 7. The second embodiment differs from the first embodiment in the shape of the first and second magnetic flux transmission parts.

According to the second embodiment, a mover 110 serving as a detection object is attached to a manual valve which switches a shift of a gearbox of a vehicle, for example. The manual valve moves linearly in an axial direction, for switching the shift of the gearbox. The mold 9 is fixed onto a separate member that is close to but separate from the manual valve. That is, the mover 110 moves linearly relative to the mold 9 that serves as a reference part.

According to the present embodiment, the position detector detects the position of the mover 110 that moves linearly relative to the mold 9. Thereby, the position of the manual valve is detected and an actual shift position of the gearbox is detected. Thus, the position detector can be used as a stroke sensor (i.e., a linear movement sensor).

As shown in FIG. 7, in the present embodiment, a first magnetic flux transmission part 24 is disposed in a cavity 111 of a rectangular shape bored in the mover 110. The first magnetic flux transmission part 24 has a center section 25, a first end section 26, and a second end section 27. The center section 25 has a straight shape which is in parallel with a virtual straight line S extending in a direction of the relative movement of the mover 110. The first end section 26 extends substantially perpendicularly from one end of the center section 25 relative to the virtual straight line S. The second end section 27 extends from the other end of the center section 25 in the same direction as the first end section 26.

A second magnetic flux transmission part 34 is also disposed in the cavity 111 of the mover 110. The second magnetic flux transmission part 34 has a center section 35, a first end section 36, and a second end section 37. The center section 35 has a straight shape which is in parallel with the virtual straight line S similar to the center section 25. The first end section 36 extends substantially perpendicularly from one end of the center section 35 relative to the virtual straight line S, to face the first end section 26. The second end section 37 extends from the other end of the center section 35 in the same direction as the first end section 36.

As shown in FIG. 7, the first magnetic flux transmission part 24 and the second magnetic flux transmission part 34 are formed in the cavity 111 of the mover 110 so that the center section 25 and the center section 35 face each other in a direction that is perpendicular to the virtual straight line S. Thereby, a rectangular shape gap 102 is defined between the center section 25 of the first magnetic flux transmission part 24 and the center section 35 of the second magnetic flux transmission part 34.

The configuration of the second embodiment is the same as that of the first embodiment, other than the above-described points.

According to the present embodiment, the magnetic flux density detected by the Hall IC 60 is illustrated by a line L1 in FIG. 4, if "a rotation position (θ)" of FIG. 4 is read as a "position" in a relative move direction of the mover 110.

In the present embodiment, by having the third and fourth magnetic flux transmission parts for preventing the decrease in the dynamic range of the magnetic flux density detected by the Hall IC 60, the position detection accuracy for detecting the position of the rotating body 12 (i.e., the throttle valve) is improved over a wider movable range.

Other Embodiments

In other embodiments of the present disclosure, if the third magnetic flux transmission part and the fourth magnetic flux transmission part are held at a position between the first ends of the first and second magnetic flux transmission parts and the second ends of the first and second magnetic flux transmission part in a non-contacting state (i.e., in contact with none of the first and second magnetic flux transmission parts and the first and second magnetic flux generators), the first molding and the second molding may be dispensed with.

Further, in the above-mentioned embodiment, the first magnetic flux transmission part, the second magnetic flux transmission part, the first magnetic flux generator, and the second magnetic flux generator are disposed on the detection object, and the magnetic flux density detector is disposed on the reference part. On the other hand, in other embodiments of the present disclosure, the first magnetic flux transmission part, the second magnetic flux transmission part, the first magnetic flux generator, and the second magnetic flux generator may be disposed on the reference part, and the magnetic flux density detector may be disposed on the detection object.

In other embodiments of the present disclosure, the polarity of the magnet disposed at a position between the both ends of the first magnetic flux transmission part and the second magnetic flux transmission part may be flipped or reversed from the orientation in the above-described embodiments.

Further, in other embodiments of the present disclosure, the motor may have a speed reducer for reducing the number of rotations to be transmitted to the output shaft.

Additionally, in other embodiments of the present disclosure, an actuator may be used, for example, as a driving power source of various devices, such as a wastegate valve operation device, a variable vane control device of a variable capacity turbocharger, a valve operation device of an exhaust throttle or an exhaust switch valve, a valve operation device of a variable air intake mechanism, and the like.

Although the present disclosure has been fully described in connection with the above embodiment thereof with reference to the accompanying drawings, it is to be noted that various changes and modifications will become apparent to those skilled in the art, and such changes and modifications are to be understood as being within the scope of the present disclosure as defined by the appended claims.

What is claimed is:

1. A position detector detecting a position of a detection object that moves relative to a reference part, the position detector comprising:

a first magnetic flux transmission part disposed on one of the detection object or the reference part, the first magnetic flux transmission part having a first end and a second end;

a second magnetic flux transmission part disposed to define a gap between the first magnetic flux transmission part and the second magnetic flux transmission part, the second magnetic flux transmission part having a first end and a second end;

a first magnetic flux generator disposed at a position between the first end of the first magnetic flux transmission part and the first end of the second magnetic flux transmission part;

a second magnetic flux generator disposed at a position between the second end of the first magnetic flux transmission part and the second end of the second magnetic flux transmission part;

a magnetic flux density detector (i) disposed on an other of the detection object or the reference part to be movable within the gap relative to the one of the detection object or the reference part and (ii) configured to output a signal according to a density of a magnetic flux passing through the magnetic flux density detector;

a third magnetic flux transmission part disposed between the first end of the first magnetic flux transmission part and the first end of the second magnetic flux transmission part and in a non-contacting state with the first magnetic flux transmission part, the second magnetic flux transmission part, and the first magnetic flux generator;

a fourth magnetic flux transmission part disposed between the second end of the first magnetic flux transmission part and the second end of the second magnetic flux transmission part and in a non-contacting state with the first magnetic flux transmission part, the second magnetic flux transmission part, and the second magnetic flux generator;

a first contiguous molding that contiguously molds the first end of the first magnetic flux transmission part, the first end of the second magnetic flux transmission part, and the third magnetic flux transmission part together to directly connect with the first contiguous molding; and a second contiguous molding that contiguously molds the second end of the first magnetic flux transmission part, the second end of the second magnetic flux transmission part, and the fourth magnetic flux transmission part together to directly connect with the second contiguous molding.

2. The position detector of claim 1, wherein
the detection object rotates relative to the reference part, and
the first magnetic flux transmission part and the second magnetic flux transmission part have a curved shape that is concentric to a center of rotation of the detection object.

3. The position detector of claim 1, wherein
the detection object linearly moves relative to the reference part, and
the first magnetic flux transmission part and the second magnetic flux transmission part have a straight shape that extends along a path of relative movement of the detection object.

4. The position detector of claim 1, wherein
the first magnetic flux transmission part has a first center section, the first center section having a shape that extends along a first virtual circle having a first radius from a rotation axis, and
the second magnetic flux transmission part has a second center section, the second center section having a shape that extends along a second virtual circle having a second radius larger than the first radius from the rotation axis.

5. The position detector of claim 1, wherein
the first magnetic flux transmission part has a first center section that extends along a first virtual circle that centers on a rot on axis, the first end and the second end of the first magnetic flux transmission part being formed to extend from respective opposite ends of the first center section in a radially outward direction away from the rotational axis of the first virtual circle, and
the second magnetic flux transmission part has a second center section that extends along a second virtual circle that centers on the rotational axis, the first end and the second end of the second magnetic flux transmission part being formed to extend from respective opposite ends of the second center section in a radially inward direction toward the rotational axis of the second virtual circle.

6. The position detector of claim 1, wherein
the magnetic flux density detector is connected to a first magnetic flux collector and a second magnetic flux collector, and
the magnetic flux density detector, the first magnetic flux collector, and the second magnetic flux collector are covered by a mold.

* * * * *